(12) United States Patent
Ravi et al.

(10) Patent No.: US 7,278,123 B2
(45) Date of Patent: Oct. 2, 2007

(54) SYSTEM-LEVEL TEST ARCHITECTURE FOR DELIVERY OF COMPRESSED TESTS

(75) Inventors: Srivaths Ravi, Plainsboro, NJ (US); Anand Raghunathan, Plainsboro, NJ (US); Loganathan Lingappan, Princeton, NJ (US); Srimat Chakradhar, Manalapan, NJ (US); Niraj K Jha, Westfield, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 10/795,231

(22) Filed: Mar. 9, 2004

(65) Prior Publication Data

US 2005/0097413 A1 May 5, 2005

Related U.S. Application Data

(60) Provisional application No. 60/511,672, filed on Oct. 17, 2003.

(51) Int. Cl.
G06F 17/50 (2006.01)

(52) U.S. Cl. .............................................. 716/4; 716/5

(58) Field of Classification Search .................... 716/1, 716/4–6; 714/738
See application file for complete search history.

(56) References Cited

U.S. PATENT DOCUMENTS

| 5,499,248 | A  | * | 3/1996  | Behrens et al. | ............. | 714/724 |
| 5,991,909 | A  | * | 11/1999 | Rajski et al.  | ................ | 714/729 |
| 6,269,455 | B1 | * | 7/2001  | Deas           | ............................ | 714/29  |
| 6,327,687 | B1 | * | 12/2001 | Rajski et al.  | ................ | 714/738 |
| 6,510,541 | B1 | * | 1/2003  | Fujiwara et al.| ................ | 716/5   |
| 6,560,756 | B1 | * | 5/2003  | Necoechea et al.| ............. | 716/4   |
| 6,675,137 | B1 | * | 1/2004  | Toprac et al.  | ................... | 703/2   |
| 2003/0120988 | A1 | * | 6/2003 | Rajski et al.  | ................ | 714/726 |
| 2003/0131298 | A1 | * | 7/2003 | Rajski et al.  | ................ | 714/738 |

* cited by examiner

*Primary Examiner*—Jack Chiang
*Assistant Examiner*—Binh Tat
(74) *Attorney, Agent, or Firm*—Sughrue Mion Pllc.

(57) ABSTRACT

An integrated circuit comprising at least one system level decompressor and at least a first hardware block associated with a core level decompressor. The system level decompressor is capable of performing system level decompression of received compressed test data to form partially decompressed test data. The core level decompressor being capable of performing core level decompression of the partially decompressed test data.

42 Claims, 7 Drawing Sheets

| Circuits | Uncompressed test data volume (#bits) | Test data volume (#bits) when a single compression scheme is used | | | Test data volume (#bits) for heterogeneous compression |
|---|---|---|---|---|---|
| | | Huffman | LZ77 | EDT | |
| s13207 | 165900 | 72224 | 34376 | 10028 | 10028 |
| s15850 | 65377 | 39865 | 36672 | NA | 36672 |
| s35932 | 28208 | 11878 | 4920 | 9387 | 4920 |
| s38417 | 179712 | 124064 | 96032 | NA | 96032 |
| s38584 | 197640 | 129526 | 108464 | 34776 | 34476 |
| Net compression for an SOC containing all the five circuits | | 41% | 55% | 53% | 72% |

FIG. 5

| Partitioning Choices | Description | Hardware overhead (no. of gates) | Processor cycles |
|---|---|---|---|
| Case I | Both ring generator + phase shifter in HW | 1920 | 151317 |
| Case II | Ring generator in SW Phase shifter in HW | 350 | 96940 |
| Case III | Both ring generator + Phase shifter in SW | 74 | 96940 |

Fig. 6

| Decompression Scheme | Number of custom Instructions | Instruction set simulation time | | |
|---|---|---|---|---|
| | | SW Implementation (# cycles) | Customized Implementation (# cycles) | Speedup |
| LZW | 5 | 1003487 | 727918 | 1.37X |
| 32-bit LFSR based | 2 | 26763 | 14246 | 1.88X |
| 64-bit LFSR based | 2 | 49733 | 14299 | 3.48X |
| 128-bit PRPG based | 2 | 56906 | 14305 | 3.98X |

Fig. 7

SYSTEM-LEVEL TEST ARCHITECTURE FOR DELIVERY OF COMPRESSED TESTS

RELATED APPLICATIONS

This Application claims priority from co-pending U.S. Provisional Application Ser. No. 60/511,672 filed Oct. 17, 2003, the contents of which are incorporated herein by reference.

FIELD

The present disclosure teaches techniques related to an architecture for efficiently delivering compressed test data to a circuit and to receive compressed results from the testing.

BACKGROUND

1. References

The following papers provide useful background information, for which they are incorporated herein by reference in their entirety, and are selectively referred to in the remainder of this disclosure by their accompanying reference symbols in square brackets (i.e., [JaS'03] for the paper by A. Jas et al):

[ITRS'01] International technology roadmap for semiconductors, 2001 edition (http://public.itrs.net)

[TestKompress] TestKompress, Mentor Graphics, http://www.mentor.com

[SoCBIST] SoCBIST, Synopsys, http://www.synopsys.com

[VirtualScan] VirtualScan, SynTest, http://www.syntest.com

[Jas'03] A. Jas, J. Ghosh-Dastidar, Mom-Eng Ng, N. A. Touba, "An efficient test vector compression scheme using selective Huffman coding", in IEEE Trans. Computer-Aided Design, Vol. 22, No. 6, June 2003

[Jas'98] A. Jas, N. A. Touba, "Test vector decompression via cyclical scan chains and its application to testing core-based designs", in Proc. International Test Conference, pp. 458-464, 1998

[Chandra'03] A. Chandra, K. Chakrabarty, "Test data compression and test resource partitioning for system-on-a-chip using frequency-directed run-length codes", in IEEE Trans. on Computers, Vol. 52, No. 8, August 2003

[Chandra'01] A. Chandra, K. Chakrabarty, "System-on-a-chip test compression and decompression architectures based on golomb codes", in IEEE Trans. Computer-Aided Design, Vol. 20, pp. 355-368, March 2001

[Chandra'02] A. Chandra, K. Chakrabarty, "Test data compression and decompression based on internal scan chains and Golomb coding", in IEEE Trans. Computer-Aided Design, Vol. 21, pp. 715-722, June 2002

[Golomb'66] S. W. Golomb, "Run-length encoding," in IEEE Trans. Inform. Theory, vol. IT-12, pp. 399-401, December 1966

[Huff'52] D. A. Huffman, "A Method for the construction of mini-mum redundancy codes", in Proc. IRE, vol. 40, 1952, pp. 1098-1101.

[Wolff'02] F. G. Wolff, C. Papachristou, "Multiscan-based test compression and hardware decompression using LZ77", in Proc. International Test Conference, pp. 331-339, 2002

[Li'03] L. Li, K. Chakrabarty, "Test data compression using dictionaries with fixed length indices", in Proc. VLSI Test Symposium, pp. 219-224, 2003

[Koenemann'91] B. Koenemann, "LFSR-coded test patterns for scan designs", in Proc. European Test Conference, pp. 237-242, 1991

[Rajski'02] J. Rajski, M. Kassab, N. Mukherjee, R. Thompson, K. Tsai, A. Hertwig, N. Tamarapalli, G. Mrugalski, G. Eide, J. Qian, "Embedded deterministic test for low cost manufacturing test", in Proc. International Test Conference, pp. 301-310, 2002

[Rajski'03] G. Mrugalski, J. Rajski, J. Tyszer, "High speed ring generators and compactors of test data", in Proc. IEEE VLSI Test Symposium, pp. 57-62, 2003

[Rajski'00] J. Rajski, N. Tamarapalli, J. Tyszer, "Automated synthesis of phase shifters for built-in self-test applications", in IEEE Trans. on Computer-Aided Design, Vol. 19, pp. 1175-1188, October 2000

[Krishna'98] C. Krishna, A. Jas, N. A. Touba, "Test vector encoding using partial LFSR reseeding", in Proc. International Test Conference, pp. 885-893, 2001

[Rajski'98] J. Rajski, J. Tyszer, N. Zacharia, "Test data decompression for multiple scan designs with boundary scan", in IEEE Trans. on Computers, Vol. 47, pp. 1188-1200, 1998

[Wohl'03] P. Wohl, J. A. Waicukauski, S. Patel, M. B. Amin, "Efficient compression and application of deterministic patterns in a Logic BIST architecture", in Proc. Design Automation Conference, pp. 566-569, 2003

[Balakrishnan'03] K. J. Balakrishnan, N. A. Touba, "Deterministic test vector decompression in software using linear operations", in Proc. VLSI Test Symposium, pp. 225-231, 2003

[Chak'93] S. T. Chakradhar, V. D. Agrawal and S. G. Roth-Weiler, "A transitive closure algorithm for test generation", IEEE Transactions on Computer-Aided Design of Integrated Circuits and Systems, Vol. 12, No. 7, pp. 1015-1028, July 1993.

[Hwang'02] S. Hwang, J. A. Abraham, "Optimal BIST using an embedded microprocessor", in Proc. International Test Conference, pp. 736-745, 2002

[Miron] M. Abramovici, M. A. Breuer, A. D. Friedman, Digital systems testing and testable design, Computer science press, New York, N.Y. 10010

[Xtensa] Xtensa microprocessor, Tensilica Inc. (http://www.tensilica.com)

[ARC] ARCtangent processor, Arc International (http://www.arc.com)

2. Overview

Test cost per chip is increasing and threatens the ability to cost-effectively design and manufacture larger and larger ICs [ITRS'01]. A major percentage of the test cost comes from the capital required for the automatic test equipment (ATE). Different approaches for reducing ATE cost have been explored, which include

- Lowering the time spent by the ATE per chip by reducing the test application time.
- Avoiding reloading of the ATE memory by decreasing the test set size
- Exploiting support from on-chip test HW and using inexpensive ATE
- Storing compressed data in the ATE memory that can be de-compressed on-chip before application.

The last approach, also referred to as test data compression, has matured in recent years, and is a useful technique for reducing rising test costs, and the explosion in the volume of data that has to be transported between the ATE and the chip under test. In test data compression, test patterns are compressed offline (during test generation) and the compressed data is stored on the tester. The tester applies this data to the chip under test and on-chip decompression hardware helps to recover the original test patterns from the compressed data.

For test responses, on-chip circuitry compresses the patterns, and the compressed response data is sent to the tester, which compares the compressed responses with the golden (correct) responses. Existing work in the field of test data compression [Jas'03, Jas'98, Chandra'01, Chandra'03, Wolff'02, Li'03, Rajski'02] explores the use of different compression/decompression algorithms and techniques to reduce test set size and test application time for a given circuit. Commercial tools that are capable of providing a test compression solution for a wide range of circuits include: Embedded Deterministic Test or Test-Kompress™ [TestKompress], SoCBIST™ [SoCBIST], and VirtualScan™ [VirtualScan].

Several approaches for compressing test data [Jas'98, Jas'03, Chandra'01, Chandra'02, Chandra'03, Wolff'02, Li'03] are based on existing compression schemes (statistical encoding, dictionary based methods, etc). Test data compression based on statistical encoding techniques like Huffman, Golomb and run-length encoding are presented in [Jas'03, Chandra'03, Chandra'02, Chandra'01, Jas'98]. While huffman coding encodes fixed length words in test data into variable length code words, run-length coding encodes variable length words into fixed length code words. Golomb coding encodes a variable length word to a variable length code word. The extent of compression that can be achieved using the above-mentioned statistical techniques also depends on the distribution of fixed/variable length words in the test data. Input data statistics play an important role in deciding the compression ratio.

Compression ratio can be improved by increasing the frequency of occurrence of selected words is by using a cyclical scan register [Jas'98]. But a major drawback with the above approach is the need for the cyclical scan register to be as long as the scan chain itself. Hence, there is a 100% hardware overhead in terms of the number of memory elements. The use of boundary scan or scan chains in other cores, not under test, as cyclical scan register reduces the hardware overhead [Jas'98]. But, this may involve significant routing overhead. Moreover, existence of boundary scan or scan chains in other cores matching the length of each scan chain in a given core is not guaranteed.

Techniques have been proposed in [Chandra'01, Chandra'02, Chandra'03] where the test difference vector is evaluated with respect to the circuit response and is compressed using golomb codes. Although, this results in a lower hardware overhead, they require an additional feedback to the ATE during decompression.

Dictionary-based test compression schemes were presented in [Wolff'02, Li'03]. These methods select strings of symbols to create a dictionary, and then encode them into equal-size code words using the dictionary. The dictionary stores the strings, and it may be either static or dynamic. The compression algorithm LZ77 is based on a dynamic dictionary and uses part of the previously seen input stream (window) as dictionary [Wolff'02]. In general, increasing the window size increases the compression ratio, which in turn implies the need for increased memory re-sources. An important step in constructing the static dictionary is to select the entries in the dictionary. This involves identifying "compatible" words that can be represented with the same dictionary entry. This is similar to the clique-partitioning problem [Li'03]. The words are mapped to the nodes of the graph and two nodes are connected if the corresponding words are "compatible".

Other methods [Rajski'98, Krishna'98, Wohl'02] for com-pressing test data use a linear feedback shift register (LFSR) to encode multiple test patterns into a single LFSR seed. In order to avoid any reduction in fault coverage, very large sized LFSR's (256-400 bits) [Wohl'02] are used to encode the test vectors of moderately sized circuits. Another approach called embedded deterministic test (EDT) [Rajski'02] obtains spatial compression by using a modified LFSR followed by a phase shifter. The phase shifter enables the use of a reasonable sized LFSR (24-32 bits) to feed a large number of scan chains. All the above techniques exploit the fact that the test cubes frequently feature a large number of unspecified positions. Hence, the compression scheme interacts with the ATPG algorithm to maximize compression. Recent work [Hwang'02] explores the use of an embedded microprocessor for executing the linear operations of a LFSR. The decompression speed is further improved by using "word-based" linear operations in the software implementations of the LFSR, which expands the compressed test data into the corresponding deterministic test vectors [Balakrishnan'03].

Related technologies for test data compression do not best exploit the hierarchical structure of modern integrated circuits, or Systems-on-chip (System LSI). For example, related technologies do not re-use the hardware for test decompression across different on-chip components or cores. Further, they do not allow for a composition of multiple, different compression algorithms for a single circuit. Finally, current test compression technologies do not provide a solution that is truly scalable across the needs of a wide range of circuits.

SUMMARY

It will be significantly advantageous to overcome problems noted above. There is provided an integrated circuit comprising at least one system level decompressor and at least a first hardware block associated with a core level decompressor. The system level decompressor is capable of performing system level decompression of received compressed test data to form partially decompressed test data. The core level decompressor being capable of performing core level decompression of the partially decompressed test data.

In a specific enhancement, the integrated circuit comprised a second hardware block, wherein a core level decompression for the first hardware block is based on a scheme different from a core level decompression for the second hardware block.

In another specific enhancement a subset of core level decompression is implemented in hardware.

In another specific enhancement, a subset of core level decompression is implemented in software.

In another specific enhancement a subset of system level decompression is implemented in hardware.

In another specific enhancement, a subset of system level decompression is implemented in software.

In still another specific enhancement, a subset of system level decompression is performed off-chip.

In still another specific enhancement, the circuit further comprises a communication circuit that enables communication between the system level decompressor and first hardware block.

In still another specific enhancement, the circuit further comprises a specialized test access mechanism for test data.

More specifically, the test access mechanism is a test bus.

More specifically, a processor used to perform core level decompression is enhanced to comprise at least one custom instruction adapted to accelerate a software implementation of the core level decompression.

More specifically, a processor used to perform system level decompression is enhanced to comprise at least one custom instruction adapted to accelerate a software implementation of the core level decompression.

In yet another specific enhancement, the circuit further comprises, at least one memory wherein test data is stored in the said memory.

In still another specific enhancement, decompression is performed by a parallel operation on multiple processors.

In another specific enhancement, core level decompression for the first hardware block is performed in parallel with core level decompression for a second hardware block.

In another specific enhancement, system level decompression and core level decompression are performed in a pipelined manner.

Another aspect of the disclosed teachings is a method of testing comprising loading compressed data from a tester to an integrated circuit. A system level decompression is performed on the compressed data to form a partially decompressed data. The partially decompressed data is transmitted through a communication circuit to at least a first hardware block. Core level decompression is performed on the partially compressed data to generate uncompressed data. Testing is performed using the uncompressed data.

Still another aspect of the disclosed teachings is a method of performing testing comprising receiving results of applying test vectors to at least a first hardware block in an integrated circuit. Core level compression of the results is performed at the hardware block to form partially compressed results. The partially compressed results are transmitted through a communication circuit. System level compression is performed on the partially compressed results.

BRIEF DESCRIPTION OF THE DRAWINGS

The disclosed teachings will become more apparent by describing in detail examples and embodiments thereof with reference to the attached drawings in which:

FIG. 5 shows Table 1 depicting comparative test data volume statistics for an SOC with a homogenous and heterogeneous compression schemes.

FIG. 6 shows Table 2 depicting hardware overhead and processor cycles for different HW/SW partitioning choices.

FIG. 7 shows Table 3 depicting improvement in test application time using customized instructions.

DETAILED DESCRIPTION

Synopsis and Advantages

Figure 1:
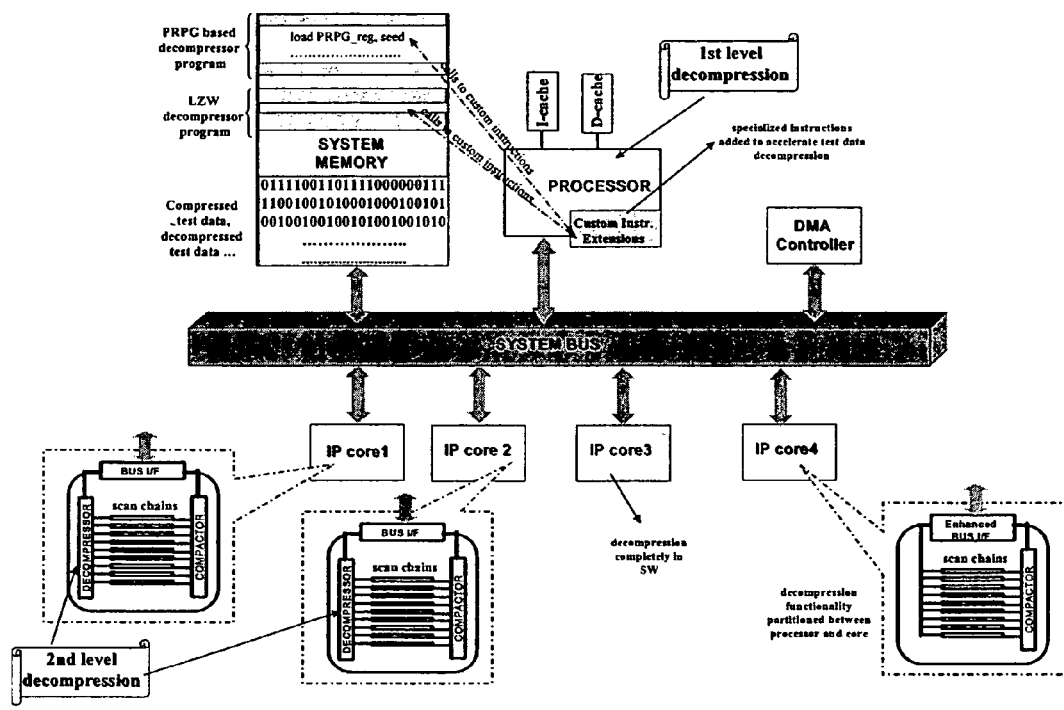
FIG. 1 is an exemplary implementation of a test architecture embodying some aspects of the disclosed teachings.

This disclosure teaches a general-purpose system-level architecture to support the delivery of compressed test data to different components in a complex heterogeneous integrated circuit, for example a system-on-chip (SOC). It should be noted that some of the examples discuss an SOC. However, the techniques are valid for any integrated circuit.

This architecture is general enough to support any compression scheme used today for a given core or component, or any new compression scheme that will be developed in the future. The following attributes are desirable for any such architecture:

FLEXIBILITY: Since different components of complex chips may have different test strategies or compression strategies, it should be flexible enough to support a wide range of test compression schemes.

HARDWARE REUSE: The hardware overheads of test data decompression can be significant, especially in SOCs with a large number of cores, and when strong or "heavy-duty" compression algorithms are used in order to obtain a high level of compression. It is desirable to reuse the SOC's constituent components for the purpose of compressed test data delivery, whenever possible.

HIGH COMPRESSION RATIOS: The hardware architecture should facilitate the use of compression schemes that obtain high compression ratios. It is desirable that the compression scheme be customized to the requirements of each core.

LOW TEST APPLICATION TIME (TAT): While the use of test data compression in itself results in an improvement in test application time, the speed with which data can be decompressed and delivered to each component on-chip can significantly affect the extent of TAT savings.

AT-SPEED TEST APPLICATION: SOCs fabricated in current and future technologies will require at-speed testing in order to detect speed related defects. It is desirable that the test compression architecture allows for at-speed delivery of test patterns to each component of the chip.

SCALABILITY: A general-purpose test architecture is used in a wide range of ICs, with vastly varying constraints such as cost and performance. It is desirable that any system-level test architecture allows for tradeoffs between hardware overhead and other metrics such as compression ratio or test application time.

The disclosed architecture addresses aspects of the above requirements by exploiting the fact that modern SOCs contain a significant amount of mission logic that can serve fairly general-purpose functions, and hence, can be adapted for test decompression and delivery. For example, SOCs contain programmable processors, which are general purpose computing platforms, and can hence be used for performing any computation such as test decompression.

Similarly, the on-chip communication architecture (buses or interconnect networks) forms a general-purpose interconnection fabric, which can be exploited to transport test data between components on chip. The system memory offers a re-usable medium for storage or buffering of compressed and decompressed test data.

A wide range of test decompression schemes can be efficiently implemented with the help of on-chip programmable processors. Further, communication architecture interfaces (e.g., bus interfaces) of different components can be enhanced to act as a specialized test wrapper that implements decompression-specific functionality. The flexibility of the proposed architecture can be exploited in several ways to benefit test decompression and delivery:

High compression ratios can be obtained by

Using a component-specific compression scheme without excessive hardware overhead. For example, some cores may use an ATPG-assisted compression technique such as embedded deterministic test (EDT), while other cores may have pre-defined test sets, which are compressed using a data coding based approach such as Huffman encoding. It should be noted that a core is a hardware block within the integrated circuit.

Using "high-effort" or "heavy-duty" compression schemes sometimes require prohibitive overheads if decompression is implemented in hardware. However, these schemes are implemented at virtually no cost when on-chip programmable processors are used for de-compression. For example, feasibility of using high-quality compression schemes such as LZ77 for test data decompression is discussed.

Using multi-level or hierarchical compression schemes. The decompressor that directly feeds test data (e.g., scan patterns) to the component under test needs to have a simple timing interface and output data at a fairly constant rate in order to avoid the use of complex clock or data control and handshaking circuitry. While various test compression schemes that have been proposed in the past satisfy this requirement, in doing so they leave significant compression opportunities "on the table". Use of a two-level decompression scheme, wherein a first level of "heavy-duty" general-purpose de-compression is performed, followed by a second level of test decompression which is able to "stream" data to the on-chip components at the desired constant rate, results in significantly higher compression efficiency.

Test application time can be improved in the proposed architecture by

Partitioning the compression functionality between the programmable processor and the test wrapper of each component. This affects both the "computation" time required to execute the decompression algorithm, and the on-chip communication time required to transport data from the processor to the component under test.

Customizing the processor to more efficiently perform decompression. The customizations could include enhancing the instruction set to add custom instructions that implement computation-intensive steps of the decompression algorithm, or a separate co-processor that per-forms decompression.

The proposed architecture using components from various industrial designs, as well as the ISCAS89 bench-marks are evaluated. Various experiments have been performed to demonstrate the benefits of the proposed architecture in test data volume reduction, hardware overhead, and test application time.

Examples Illustrating Concepts Underlying the Disclosed Teachings

FIG. 1 shows an exemplary architecture that embodies aspects of the disclosed teachings. In order to maximize the compression of test vectors for any of the IP cores 1-4, the architecture exploits a two-level test compression scheme. At the core level, the compression schemes for some IP cores may be predefined (e.g., IP cores 1 and 2 in the figure), while other IP cores may be associated with predefined test sets or allow for the definition of a suitable compression scheme (e.g., IP cores 3 and 4 in the figure). Both statistical encoding techniques (Huffman, run-length, Golomb) and LFSR based schemes (EDT, D-BIST) are suitable at this level. In Section IV.B.1, it will be seen that the diverse test characteristics of the different IP cores warrant the use of heterogeneous compression schemes at the core level.

Further compression can be achieved on top of the core-level compression schemes by using a second level of compression. As discussed further below, the use of strong compression schemes such as LZ77 at the system level will result in higher compression ratios for several IP cores. In addition, exploiting the on-chip processor and system memory for decompression will allow for the efficient deployment of the SW implementations of system-level de-compression schemes that are otherwise hard to implement in hardware. System-level decompression can also be used to implement de-compression functionality that is reused across several cores.

For example, schemes such as D-BIST require the use of PRPGs that are 250-500 bits long, along with equally long shadow registers. In such a case, the system-level compression scheme can efficiently implement the PRPG functionality used across several cores resulting in significant hardware savings (e.g., IP core 3 has the decompression functionality completely implemented in SW while IP core 4 shows partitioning of decompression functionality). The trade-offs associated with the partitioning of test decompression functionalities are discussed studied in Section IV.B.3.

From a test application time standpoint, the on-chip programmable processor used to perform system-level decompression can be enhanced using special custom instructions that accelerate the SW implementations of the system level decompression schemes. This is shown in the figure, wherein both the PRPG functionality and LZW decompression programs are instrumented to directly use specialized custom instructions. These customizations are discussed further in Section IV.B.4.

Before proceeding to study the various aspects of the system-level decompression architecture, the experimental setup used is described. It should be noted that the experimental setup is merely illustrative and is used to demonstrate the efficacy of the disclosed teachings.

System-level benchmarks: The example SOCs considered in the experiments consisted of an Xtensa processor from Tensilica, system memory and various cores (ISCAS'89 benchmarks as well as industrial designs). The Xtensa processor is a five-pipeline stage, embedded RISC processor. Full scan versions of each core were considered, with single or multiple scan chains inside them.

Test generation and compression: The test vectors for the cores were generated using the ATPG tool TRAN [Chak'93]. Dynamic compaction was turned "on" during test vector generation in order to obtain a minimum sized test set and to get a realistic evaluation of the compression algorithms. The main compression schemes used in this work are Huffman, EDT and LZ77. C implementations of Huffman and LZ77 schemes were used to generate the corresponding compressed test vectors. Compressed test vectors in the case of EDT have to be generated during ATPG itself.

Test generation in [Rajski'02] proceeds by iterating through the following steps (a) using combinational ATPG to determine the test vector values in the different scan chain flip-flops and circuit primary inputs, (b) using a linear solver to determine the vectors at the inputs of the EDT decompression hardware (injectors) corresponding to the values in (a). An alternative methodology is used to generate the compressed test vectors in EDT. The EDT decompression hardware (ring generator+phase shifter) is unrolled as many times as the maximum length of scan chains in a given core.

This allows establishment of a relationship between the output of each flip-flop and inputs (injectors) to the ring generator over different time-frames. This association is converted into a set of XOR gates. Hence, the new input list of this modified circuit consists of the inputs to the ring generator over as many time-frames as the maximum length of scan chains in the given circuit. The regular inputs in the given circuit are also assumed to be part of a scan chain. Since all circuits considered are full-scan, the input to each flip-flop is converted into a primary output. Hence, the modified circuit does not contain any sequential elements. Combinational test generation plus dynamic compaction is now performed on the modified circuit to obtain the compressed test vectors.

Decompression: C implementations of the Huffman, LZ77 and EDT decompression algorithms were designed. In addition, Verilog RTL implementations of Huffman [Jas'03] and EDT de-compression schemes were also developed. The hardware overhead of the decompression hardware is obtained by synthesizing it using the SYNOPSYS design compiler. The libraries used for synthesis are standard.sidb and gtech.db.

Simulation: The binary memory image of the test program performing system-level decompression and test vector delivery was generated by first cross-compiling the C implementation of the algorithm using Xtensa's cross-compilation flow. RTL simulation of the processor, bus and the bus interfaces of different cores enhanced with core-specific decompression hardware with the binary memory image loaded into the system memory was performed using the simulator MODELSIM.

Processor Customization: The Xtensa processor, being an extensible processor, allows for augmentation of its basic instruction set with custom instructions. The customized instructions, used to reduce the test application time and hardware overhead, are written in Tensilica Instruction Extension (TIE) language and instrumented in the C descriptions of the decompression SW. The Xtensa instruction set simulator is used to evaluate the speedup achieved from using custom instructions. The RTL description of the customized processor is generated using the Xtensa processor generator.

1. Heterogeneous Compression

Different IP cores on a SOC have different test requirements. Some cores are associated with predefined test sets. ATPG-assisted compression schemes like EDT do not yield good compression ratios for such predefined test sets. This is due to the inherent correlation in the output vector/vectors of a LFSR. Also, compression ratios vary for a given compression scheme based on the distribution of user-defined symbols/words in the test sets of different cores. Hence, for a given SOC, selecting core specific compression schemes can maximize the net compression ratio. The following example illustrates this concept.

Example 1: Consider an example SOC with 5 different cores. The cores (s13207, s15850, s35932, s38417, s38584) are taken from the ISCAS'89 benchmark suite. In order to model the fact that IP cores are associated with pre-existing test sets, it is assumed that test sets for the cores s15850 and s38417 are predefined. Three different compression schemes (Huffman, EDT and LZ77) are used and the effectiveness of choosing a single compression scheme for all the IP cores is evaluated. Table 1, shown in FIG. 5, reports the results, wherein the column labeled "original # of bits" indicates the distribution of uncompressed test data volume for all the five cores. When Huffman and LZ77 compression algorithms are employed for all the cores, significant compression is achieved overall (41% and 55%, respectively). If EDT is the compression algorithm of choice for all the cores, the test sets for all the cores except s15850 and s38417 can be compressed (EDT is ATPG-assisted), resulting in 53% net compression. Table 1 reports the test data volume statistics for the individual cores in the different cases and highlights the best case compression scheme for each core. Clearly, the highest net compression can be obtained by choosing a heterogeneous compression scheme, wherein the best compression scheme is chosen for each core (LZ77 for cores s15850, s35932 and s38417, and, EDT for cores s13207 and s38584) resulting in 72% compression.

2. Multi-Level Test Compression

In this section, use of a combination of system-level and core-level compression schemes that enable the generation of highly compressed test data is discussed. How such a multi-level decompression can be efficiently performed on an SOC is also discussed.

a) Achieving Better Compression

Conventional test data compression schemes [Rajski'02, Jas'03, Chandra'03] do not fully exploit the opportunities for compression. A large percentage of the test data of a given circuit comprises of unspecified\don't care bits [Rajski'02]. These bits can be set in such a way so that the compression ratio is maximized [Jas'03]. The compressed data still contains a large number of repeated codes and hence further compression can be achieved by using a second level "heavy-duty" compression scheme like LZW, LZ77 etc. These compression schemes are referred to as "heavy-duty" because the compression and decompression stages require significant memory resources to maximize compression. Both LZW and LZ77 are dictionary-based compression schemes and bigger dictionaries lead to comparable or higher compression ratios. For example, gzip, which uses a variant of the LZ77 compression scheme, uses a 258 byte long window buffer and a 32 KB long lookahead buffer for compression and decompression. Using a hardware implementation of the "heavy-duty" decompression algorithms for each core in the SOC would result in an unrealistic hardware overhead.

By exploiting the on-chip processor and the system memory, the disclosed architecture (for example, FIG. 1) naturally supports such a multi-level decompression scheme. The "heavy-duty" decompression scheme can be efficiently implemented in software on the processor while the core-level decompression schemes like EDT, Huffman etc. can be implemented in hardware and integrated with the test wrapper. Such a multi-level compression/decompression scheme leads to higher compression ratios compared to single core-specific compression schemes. Also, the hardware overhead is comparable or marginally greater than the other approaches.

Figure 2:
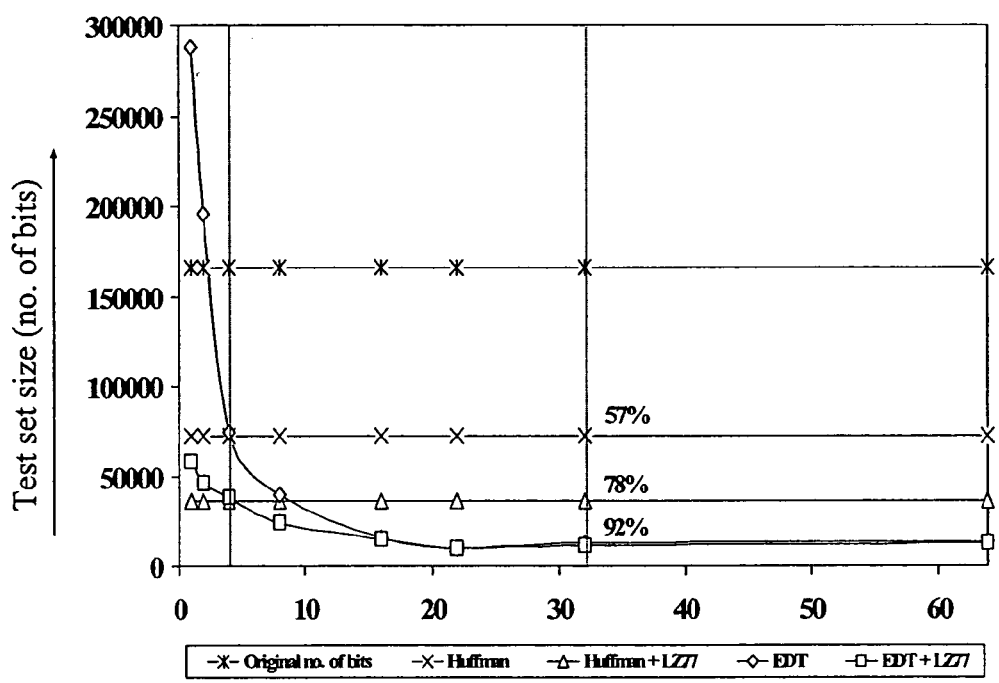
FIG. 2 provides a comparison of two-level compression schemes for different example scan configurations.

Example 2: FIG. 2 shows the test set size for a particular core (s13207) before and after compression for different multi-level compression strategies and for different scan chain configurations. The first-level or local compression schemes are core-specific (EDT or Huffman). The second-level or "heavy-duty" decompression scheme is based on the LZ77 compression/decompression algorithm. The straight lines in FIG. 2 represent the sizes of the uncompressed test set, test set compressed using Huffman encoding alone and test set compressed using Huffman encoding followed by LZ77 compression scheme. Huffman encoding and the two-level Huffman–LZ77 compression schemes give the same compression ratio for different scan chain configurations as the compression is performed for a fixed test set obtained by performing test generation on the given full scan circuit. Huffman+LZ77 compression scheme yields a compression ratio of 78% as compared to the 57% compression ratio obtained using Huffman encoding alone. The two curved lines in FIG. 2 represent the size of the compressed test set using EDT and EDT followed by LZ77 compression scheme.

In embedded deterministic test (EDT), longer scan chains imply greater linear dependence in the inputs to a particular scan chain, hence resulting in an increased number of test vectors. This is clearly observed in FIG. 2, where initially the number of bits obtained by EDT is greater than the uncompressed test set size, but as the number of scan chains is increased, the compression ratio improves. When the number of scan-chains is 4, the compression ratios obtained by using EDT and EDT+LZ77 are around 57% and 78% respectively. If the number of scan chains is increased to 32, then both EDT and EDT+LZ77 compression schemes yield a compression ratio of 92%. For longer scan chain configurations, increasing the number of injectors reduces this dependence but results in lower spatial compression. In this experiment the number of injectors is taken to be '1' for all the scan chain configurations.

Figure 3:
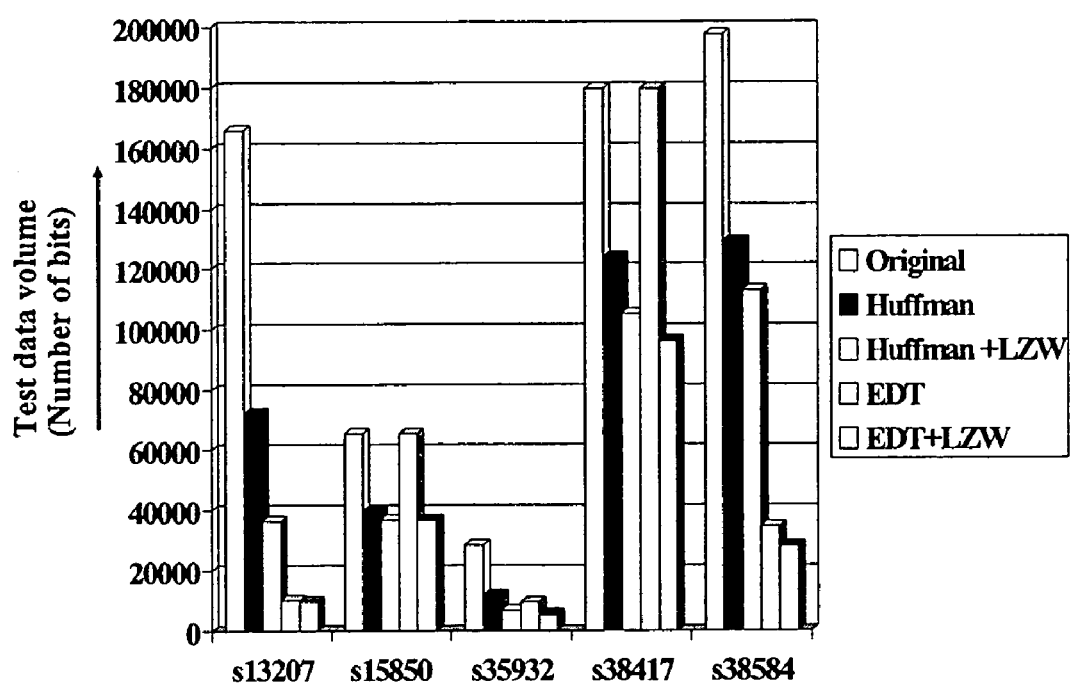
FIG. 3 provides additional comparative data for a single level and two-level compression schemes.

Example 3: FIG. 3 presents the compression ratios obtained using the two-level compression schemes for the different cores in Example 1.

b) Decompression and Delivery

Since the test data usually contains long strings of identical bits, the compressed data obtained from the first level compression scheme (EDT or Huffman) also contains strings of identical codes. Dictionary based schemes like LZ77 encode such strings into small dictionary indices. This is also due to the large sizes of sliding buffer and lookahead buffer. During the second-level or "heavy-duty" decompression, the encoded symbols or indices get decoded into a large number symbols or input bits to the first-level or "core-specific" decompression scheme. These are decoded serially and fed to the scan chains.

Figure 4:
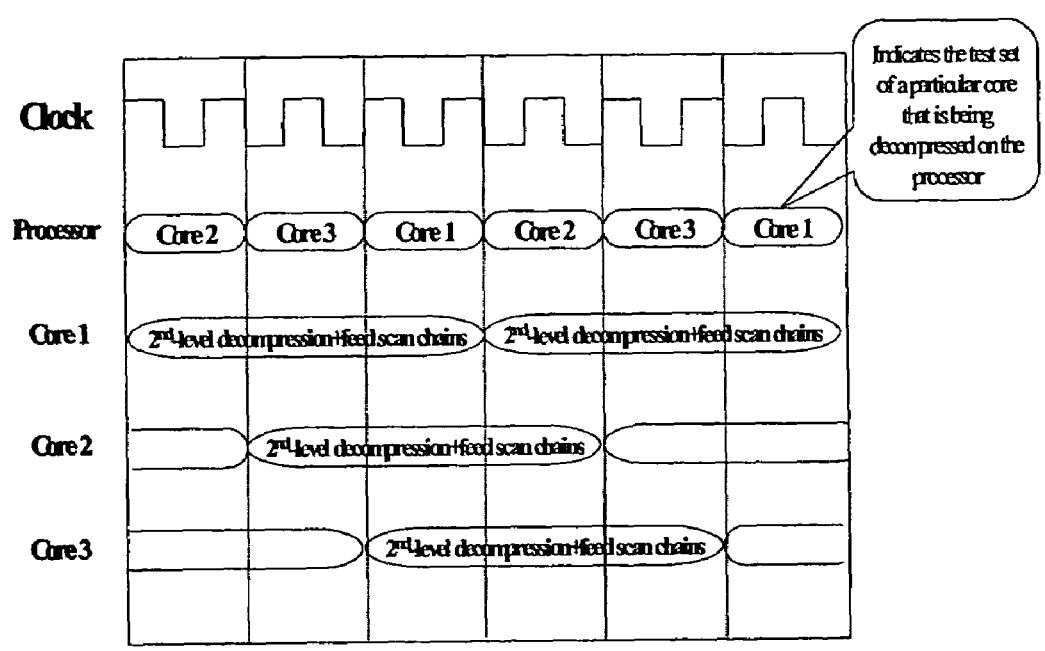
FIG. 4 shows a pipelined implementation of a multi-level decompression scheme.

This scenario presents an opportunity for pipelining the decompression scheme on the processor and the decompression schemes on different cores. FIG. 4 shows such a case where decompression on the processor is almost three times as fast as decompression on cores 1, 2 and 3. Hence, by the time a core finishes decoding the input symbols, feeding the scan-chains and compacting the test responses, the processor can decode the input from the system memory for two other cores.

3. Flexible Partitioning

A variety of options are available for implementing the multi-level decompression scheme. The "heavy-duty" decompression is implemented in software using the embedded processor, as other-wise a hardware implementation will require unreasonable memory and computational resources. However, the core-level decompression algorithms can be either implemented in HW/SW. Furthermore, the decompression functionality can be partitioned between the processor (SW) and the test wrapper (HW). For example, in the case of DBIST [Wolff'02], the LFSR can be either implemented in hardware or in software. On the other hand, in the case of EDT, either both the ring generator and the phase shifter can be implemented in HW/SW or the ring generator can be implemented in hardware and the phase shifter can be implemented in software.

The choice of partitioning of the decompression functionality decides the workload of processor and test wrapper as well as the communication requirements between the processor and the test wrapper. Hence, the hardware overhead for decompression and the test application time depends on the decompression algorithm and the choice of partitioning. Hence, for each core, a different partitioning scheme may be optimal depending on the circuit statistics and the decompression algorithm.

Example 4: Table 2 (shown in FIG. 6) shows the hardware overhead and the number of processor cycles taken by the decompression algorithm for different partitioning (or implementation) choices of the algorithm on an example core (s5378). The results depicted represent the EDT decompression scheme. The hardware overheads for different cases were obtained by synthesizing the test wrapper (HW part of the decompression algorithm) using the Synopsys generic libraries (standard.sldb, gtech.db) and the processor cycles were obtained from RTL simulation (using Modelsim's simulation tool) of the processor along with the test wrapper.

Three different configurations are considered. In case I, both the ring generator and phase shifter are implemented in HW. In case II, the ring generator is implemented in SW whereas the phase shifter is implemented in hardware. Finally, Case III has SW implementations for the ring generator and phase shifter.

The performances of the three cases are analyzed below.

In case I, the processor needs to transfer only the ring generator inputs to the core's test wrapper.

In case II, for each single bit input to the processor, the entire LFSR state needs to be transmitted from the processor to the test wrapper. Hence, the communication period per input bit to the ring generator increases. On the other hand, the hardware overhead comes down as the LFSR is efficiently implemented in SW using custom bit-level instructions, as explained in the next section. The HW overhead reported includes the additional overhead required for the custom instruction.

In case III, the communication period increases compared to case II provided the size of the phase shifter is bigger than the length of ring generator. In this case the size of the phase shifter is comparable to that of the ring generator. Hence, the test application times, for both cases, are comparable. However, there is a reduction in the hardware overhead as the XOR operations are efficiently integrated with the custom instructions used in case II.

The above example illustrates the tradeoffs between test application time and hardware overheads for the EDT decompression scheme. Moving the functionality to the embedded microprocessor increases the test application time but decreases the hardware over-head. Hence, the partitioning of the decompression functionality should be done based on the limits of hardware overhead and test application time for each core and the entire SOC.

4. Processor Customization

Programmable processor may be quite inefficient in performing some decompression algorithms. For example, EDT [Rajski'02] and DBIST [Wolff'02] have a large number of bit-level operations, which can be performed much faster on application specific hard-ware than on a programmable processor. However, modern processors (Xtensa from Tensilica [Xtensa] and ARCtangent from ARC [ARC]) often feature the option to customize the processor by adding application specific instructions, or coprocessor units, to efficiently perform selected computations. A large number of compression schemes [Koenemann'91, Rajski'02, Wolff'02] use LFSRs for test vector decompression.

In the example implementations discussed herein, a regular C implementation of a 64-bit LFSR is used. A custom instruction is introduced to improve its performance. Using the custom instruction does not change the functionality of the decompression algorithm. Custom instructions are defined using the Ten-silica Instruction Extension (TIE) language. The user-register semantics is used to map a user-defined state to a user-register file. The registers can be as wide as 32 bits. Hence, the new state of the LFSR can be obtained by doing some bit manipulations on the initial state of the LFSR and the coefficient vector, defined by the positions of the XOR taps (or the characteristic polynomial). Note that the custom instruction can handle any 64 bit LFSR. Since the coefficient vector (or primitive polynomial) and the initial state are inputs to the customized instruction, the same instruction can be used for different cores using LFSRs based on different primitive polynomials.

Table 3 (shown if FIG. 7) shows the improvement in test application time achieved due to the introduction of custom instructions. The results were obtained using the Xtensa instruction set simulator. Each of the LFSR implementations was simulated for 20 successive LFSR states. The LZW decompression algorithm was simulated using the compressed test set of the ISCAS benchmark s9234. As the size of the LFSR is increased, the time taken by the regular C implementation of the LFSR increases. In fact, when the size of the LFSR is increased from 32-bit to 64-bit, the time taken by the regular implementation doubles. On the other hand, the time taken by the implementation using customized instructions remains the same for all the three cases. This clearly indicates the improvement that can be achieved in test application time by using instructions tailored to the decompression algorithm.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An integrated circuit comprising:
   at least one system level decompressor;
   at least a first hardware block associated with a core level decompressor;
   the system level decompressor operable to perform system level decompression of received compressed test data to form partially decompressed test data and
   the core level decompressor operable to perform core level decompression of the partially decompressed test data
   thereby performing a two-level decompression.

2. The integrated circuit of claim 1, further comprising:
   a second hardware block, wherein a core level decompression for the first hardware block is based on a scheme different from a core level decompression for the second hardware block.

3. The integrated circuit of claim 1 where a subset of core level decompression is implemented in hardware.

4. The integrated circuit of claim 1 where a subset of core level decompression is implemented in software.

5. The integrated circuit of claim 4, wherein a processor used to perform core level decompression is enhanced to comprise at least one custom instruction adapted to accelerate a software implementation of the core level decompression.

6. The integrated circuit of claim 1 where a subset of system level decompression is implemented in hardware.

7. The integrated circuit of claim 1 where a subset of system level decompression is implemented in software.

8. The integrated circuit of claim 7, wherein a processor used to perform system level decompression is enhanced to comprise at least one custom instruction adapted to accelerate a software implementation of the core level decompression.

9. The integrated circuit of claim 1, wherein a subset of system level decompression is performed off-chip.

10. The integrated circuit of claim 1, further comprising a communication circuit that enables communication between the system level decompressor and first hardware block.

11. The integrated circuit of claim 1, further comprising a specialized test access mechanism for test data.

12. The integrated circuit of claim 11, wherein the test access mechanism is a test bus.

13. The integrated circuit of claim 1, further comprising at least one memory wherein test data is stored in the said memory.

14. The integrated circuit of claim 1, wherein decompression is performed by a parallel operation on multiple processors.

15. The integrated circuit of claim 1 wherein core level decompression for the first hardware block is performed in parallel with core level decompression for a second hardware block.

16. The integrated circuit of claim 1, wherein system level decompression and core level decompression are performed in a pipelined manner.

17. A method of testing comprising:
   a) loading compressed data from a tester to an integrated circuit;
   b) performing a system level decompression on the compressed data to form a partially decompressed data;
   c) transferring the partially decompressed data through a communication circuit to at least a first hardware block;
   d) performing a core level decompression on the partially compressed data to generate uncompressed data; and
   e) performing testing using the uncompressed data,
      thereby performing a two-level decompression.

18. The method of claim 17 wherein core level decompression for the first hardware block is based on a scheme different from a core level decompression for a second hardware block.

19. The method of claim 17 wherein a subset of core level decompression is implemented in hardware.

20. The method of claim 17 wherein a subset of core level decompression is implemented in software.

21. The method of claim 20, wherein a processor used to perform core level decompression uses at least one custom instruction that accelerates the software implementation of the core level decompression.

22. The method of claim 17 wherein a subset of system level decompression is implemented in hardware.

23. The method of claim 17 wherein a subset of system level decompression is implemented in software.

24. The method of claim 23, wherein a processor used to perform core level decompression uses at least one custom instruction that accelerates the software implementation of the core level decompression.

25. The method of claim 17, wherein a subset of system level decompression is performed off-chip.

26. The method of claim 17, wherein test data is stored at least one location within the integrated circuit.

27. The method of claim 17, wherein decompression is performed by a parallel operation on multiple processors.

28. The method of claim 17 wherein core level decompression for the first hardware block is performed in parallel with core level decompression for a second hardware block.

29. The method of claim 17, wherein system level decompression and core level decompression are performed in a pipelined manner.

30. A method of performing testing comprising:
   a) receiving results of applying test vectors to at least a first hardware block in an integrated circuit;

b) performing core level compression of the results at the hardware block to form partially compressed results;
c) transmitting the partially compressed results through a communication circuit; and
d) performing system level compression of the partially compressed results thereby performing a two-level compression.

31. The method of claim 30 wherein core level compression for the first hardware block is based on a scheme different from a core level compression for a second hardware block.

32. The method of claim 30 where a subset of core level compression is implemented in hardware.

33. The method of claim 30 where a subset of core level compression is implemented in software.

34. The method of claim 33, wherein a processor used to perform core level compression uses at least one custom instruction that accelerates the software implementation of the core level compression.

35. The method of claim 30 where a subset of system level compression is implemented in hardware.

36. The method of claim 30 where a subset of system level compression is implemented in software.

37. The method of claim 36, wherein a processor used to perform core level compression uses at least one custom instruction that accelerates the software implementation of the core level compression.

38. The method of claim 30, wherein a subset of system level compression is performed off-chip.

39. The method of claim 30, wherein test data is stored in more than one location.

40. The method of claim 30, wherein compression is performed by a parallel operation on multiple processors.

41. The method of claim 30 wherein core level compression for the first hardware block is performed in parallel with core level compression for a second hardware block.

42. The method of claim 30, wherein system level compression and core level compression are performed in a pipelined manner.

* * * * *